(12) United States Patent
Rai et al.

(10) Patent No.: US 7,033,682 B1
(45) Date of Patent: Apr. 25, 2006

(54) COATING SOLUTIONS FOR TITANIUM AND TITANIUM ALLOY MACHINING

(75) Inventors: Amarendra K. Rai, Dayton, OH (US); Satish J. Dixit, Beavercreek, OH (US); Rabi S. Bhattacharya, Dayton, OH (US)

(73) Assignee: UES, Inc., Dayton, OH (US)

( * ) Notice: Subject to any disclaimer, the term of this patent is extended or adjusted under 35 U.S.C. 154(b) by 398 days.

(21) Appl. No.: 10/034,852

(22) Filed: Dec. 28, 2001

(51) Int. Cl.
*B32B 9/00* (2006.01)

(52) U.S. Cl. ............... 428/698; 428/469; 428/472; 428/697; 428/699; 428/701; 428/702; 51/307; 51/309

(58) Field of Classification Search ............ 428/216, 428/336, 698, 697, 699, 701, 702, 704, 469, 428/472; 51/307, 309
See application file for complete search history.

(56) References Cited

U.S. PATENT DOCUMENTS

| | | | |
|---|---|---|---|
| 3,755,164 A * | 8/1973 | Van Wyk | |
| 4,343,909 A | 8/1982 | Adams et al. | |
| 4,554,201 A * | 11/1985 | Andreev et al. | 428/699 |
| 4,701,384 A * | 10/1987 | Sarin et al. | |
| 4,702,970 A * | 10/1987 | Sarin et al. | |
| 4,728,448 A * | 3/1988 | Sliney | |
| 4,863,490 A * | 9/1989 | Buljan et al. | 51/309 |
| 4,880,755 A * | 11/1989 | Mehrotra | 51/307 |
| 4,900,579 A * | 2/1990 | Lee et al. | |
| 5,330,853 A * | 7/1994 | Hofmann et al. | 428/697 |
| 5,503,912 A * | 4/1996 | Setoyama et al. | 428/699 |
| 5,503,913 A * | 4/1996 | Konig et al. | 428/698 |
| 5,607,264 A * | 3/1997 | Konig et al. | 428/702 |
| 5,700,551 A * | 12/1997 | Kukino et al. | 428/336 |

(Continued)

FOREIGN PATENT DOCUMENTS

| | | | |
|---|---|---|---|
| DE | 1981872 | * | 10/1999 |
| GB | 2048960 | * | 12/1980 |
| JP | 62191486 | * | 2/1986 |

(Continued)

OTHER PUBLICATIONS

Ehglish abstract of SU 1766629.*

(Continued)

*Primary Examiner*—Archene Turner
(74) *Attorney, Agent, or Firm*—Dinsmore & Shohl LLP

(57) ABSTRACT

Advanced machine tool coatings for Ti machining are presented. The coatings of the present invention provide for protection from chemical reactivity and higher cutting temperatures. In accordance with one embodiment of the present invention, a coated machine tool is provided including a relatively hard underlayer and a chemically inert overlayer. The relatively hard underlayer is formed over the base material of the machine tool. The overlayer is formed over the underlayer, is chemically inert with respect to titanium, and comprises an oxide of yttrium or another metal oxide. In accordance with another embodiment of the present invention, a coated machine tool is provided including an alkaline earth metal fluoride overlayer that is substantially chemically inert with respect to titanium. The overlayer includes a metal intermixed with the metal fluoride. The intermixed metal is softer than the base material.

5 Claims, 3 Drawing Sheets

U.S. PATENT DOCUMENTS

| | | | |
|---|---|---|---|
| 5,789,071 A * | 8/1998 | Sproul et al. | |
| 5,824,123 A * | 10/1998 | Chatterjee et al. | |
| 5,882,777 A * | 3/1999 | Kukino et al. | 428/698 |
| 5,965,253 A * | 10/1999 | Rechberger et al. | 428/701 |
| 6,001,470 A * | 12/1999 | Niwa et al. | |
| 6,033,768 A * | 3/2000 | Muenz et al. | 428/699 |
| 6,077,596 A * | 6/2000 | Hashimoto et al. | 428/469 |
| 6,142,258 A * | 11/2000 | Chepovetsky et al. | |
| 6,274,249 B1 | 8/2001 | Braendle et al. | |
| 6,565,957 B1 * | 5/2003 | Nakamura et al. | 51/309 |

FOREIGN PATENT DOCUMENTS

| | | | |
|---|---|---|---|
| JP | 62196351 | * | 8/1987 |
| JP | 03161162 | * | 7/1991 |
| JP | 05330956 | * | 12/1993 |
| JP | 08199341 | * | 8/1996 |

OTHER PUBLICATIONS

E. O. Ezugwu, Z. M. Wang, Titanium alloys and their machinability—a review, Journal of Materials Processing Technology 68 (1997) 262-274.

* cited by examiner

COATING SOLUTIONS FOR TITANIUM AND TITANIUM ALLOY MACHINING

STATEMENT REGARDING FEDERALLY SPONSORED RESEARCH OR DEVELOPMENT

This invention was made with government support under Contract No. F33615-01-M-5301 awarded by the U.S. Department of Defense. The Government has certain rights in this invention.

BACKGROUND OF THE INVENTION

The present invention relates to titanium machining. There is a continuing drive in aerospace and other industries to find an effective and economical means of machining titanium. In fact, Ti represents one of the most difficult materials to machine. Machining of Ti often requires frequent tool replacement and involves significant down time. In addition, Ti machining is usually done at lower cutting speeds, requiring longer production times.

BRIEF SUMMARY OF THE INVENTION

According to the present invention, advanced machine tool coatings for Ti machining are presented. The coatings of the present invention provide for protection from chemical reactivity and higher cutting temperatures. In accordance with one embodiment of the present invention, a coated machine tool is provided comprising a relatively hard underlayer and a chemically inert overlayer. The relatively hard underlayer is formed over the base material of the machine tool. The overlayer is formed over the underlayer and is substantially chemically inert with respect to titanium and comprises an oxide of yttrium or another metal oxide.

In accordance with another embodiment of the present invention, a coated machine tool is provided comprising an alkaline earth metal fluoride overlayer that is substantially chemically inert with respect to titanium. The overlayer comprises a metal intermixed with the metal fluoride. The intermixed metal is softer than the base material.

In accordance with yet another embodiment of the present invention a process for coating a machine tool is provided. According to the process, a coated machine tool is produced by forming a relatively hard underlayer over a base material of the machine tool and forming a chemically inert yttrium oxide overlayer over the underlayer. The overlayer and the underlayer are formed by introducing the base material into a vacuum deposition chamber, evacuating the deposition chamber, heating the base material in the deposition chamber, and activating selectively a plurality of cathodic arc discharge sources in communication with the deposition chamber. One of the cathodic arc discharge sources comprises a yttrium source and another of the cathodic arc discharge sources comprises a source of underlayer material.

In accordance with yet another embodiment of the present invention a process for coating a machine tool is provided. According to the process, a coated machine tool is produced by forming a chemically inert alkaline earth metal fluoride overlayer intermixed with a metal softer than a base material of the machine tool. The overlayer is substantially chemically inert with respect to titanium and is formed over the base material by introducing the base material into a vacuum deposition chamber, evacuating the deposition chamber, introducing an inert gas into the deposition chamber, and initiating a magnetron sputtering operation in the deposition chamber. The magnetron sputtering operation is characterized by deposition of a chemically inert alkaline earth metal fluoride and a soft metal over the base material.

Accordingly, it is an object of the present invention to provide advanced machine tool coatings for Ti machining. Other objects of the present invention will be apparent in light of the description of the invention embodied herein.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals and in which.

DETAILED DESCRIPTION

Figure 1:
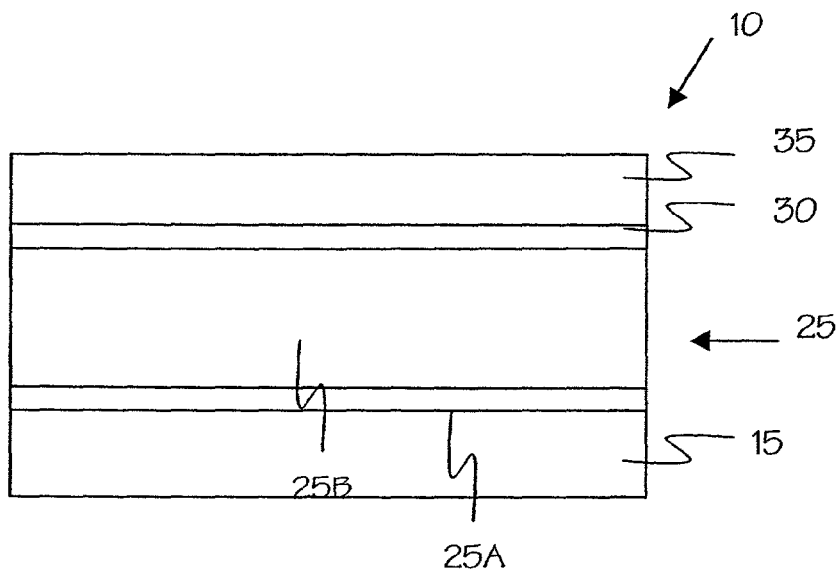
FIG. 1 is a schematic illustration of a coated machine tool according to one embodiment of the present invention.

Referring initially to FIG. 1, a coated machine tool 10 according to one embodiment of the present invention is illustrated. The coated machine tool 10 comprises a multi-layer wear resistant coating 20 for application to a base material 15 of the machine tool 10. In the illustrated embodiment, the coating 20 comprises a relatively hard underlayer 25, a chemically inert overlayer 35, and an interlayer 30 between the underlayer 25 and the overlayer 35. The base material 15 may be any suitable material and is typically cobalt cemented carbide or high speed steel.

The relatively hard underlayer 25 is formed over the base material 15 of the machine tool 10. The overlayer 35 is formed over the underlayer 25 and is substantially chemically inert with respect to titanium. The use of a chemically inert layer is particularly advantageous because it is not susceptible to the diffusion, dissolution, bonding or welding that would otherwise be associated with titanium machining by conventional means.

The overlayer 35 may comprise, for example, an inert metal oxide such as $Y_2O_3$, an oxide of yttrium (Y). $Y_2O_3$ is particularly well-suited for titanium machining because it is not chemically reactive with titanium or titanium alloys and helps minimize high cutting temperatures typically associated with titanium machining. For the purposes of describing and defining the present invention, it is noted that a material may be considered substantially chemically inert with respect to titanium (Ti) if it exhibits positive free energies of reaction with Ti and, as such, defines a positive heat of formation. It is contemplated that the metal oxide overlayer may comprise a rare earth oxide or, more specifically an oxide of scandium ($Sc_2O_3$), lanthanum ($La_2O_3$), zirconium, hafnium, or niobium.

In the illustrated embodiment, the relatively hard underlayer 25 comprises a pair of layers—a metal layer 25A and a metal nitride, carbide, or carbo-nitride layer 25B. In many instances, inclusion of only the metal nitride, carbide, or carbo-nitride layer 25B will suffice. However, it may be preferable to include the metal layer 25A to enhance the bond between the underlayer 25 and the base material 15.

The metal layer 25A may comprise a layer of material selected from a group comprising Ti, Cr, Al, and combinations thereof. The metal nitride, carbide, or carbo-nitride layer 25B may comprise Ti, Cr, Al, Zr, Hf, Y, Nb, V, and combinations thereof. More specifically, the layer 25B may comprise TiN, TiCN, TiAlN, or TiAlYN.

In one embodiment of the present invention, the chemically inert overlayer 35 has a thickness of about 0.6 microns. Thicknesses between about 0.5 and about 3.0 microns are also contemplated. The relatively hard underlayer 25 may have a thickness of about 2 microns. Thicknesses between about 1 and about 5 microns are also contemplated.

The interlayer 30 may be provided to increase the bond strength between the underlayer 25 and the overlayer 35. For example, the interlayer 30 may comprise TiAl or another metal selected from Ti, Al, Zr, Hf, Nb, V, and combinations thereof. It is contemplated that the interlayer may comprise at least two different materials, e.g., Ti and Y, and the relative proportions of the two different materials may be graded across the interlayer. For example, where yttrium oxide is employed as the overlayer 35, the amount of Y in the interlayer 30 may increase from the relatively hard underlayer 25 to the chemically inert overlayer 35.

Figure 2:
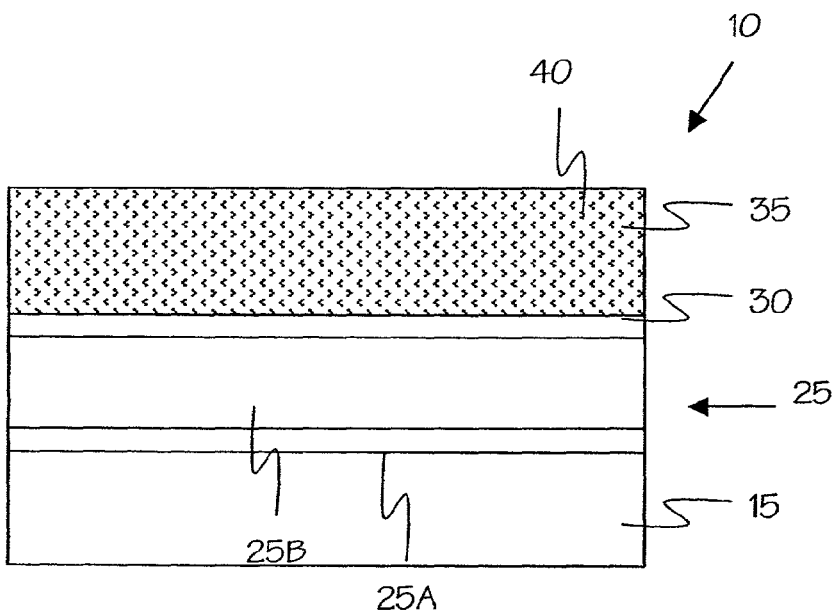
FIG. 2 is a schematic illustration of a coated machine tool according to another embodiment of the present invention.

Referring now to FIG. 2, a coated machine tool 10 according to another embodiment of the present invention is illustrated. As is the case in the embodiment of FIG. 1, the coated machine tool 10 comprises a multilayer wear resistant coating 20 for application to a base material 15 of the machine tool 10. In the illustrated embodiment, the coating 20 comprises a relatively hard underlayer 25, a chemically inert overlayer 35, and an interlayer 30 between the underlayer 25 and the overlayer 35.

The overlayer 35 comprises an alkaline earth metal fluoride that is substantially chemically inert with respect to titanium. For example, the metal fluoride may comprise calcium fluoride or barium fluoride, both of which are chemically inert with respect to titanium. The overlayer 35 further comprises a relatively soft metal 40 intermixed with the metal fluoride. For example, the intermixed metal would typically be softer than the base material 15. More specifically, the overlayer 35 could comprise $CaF_2$+Ag or $BaF_2$+Ag. The overlayer may have a thickness of between about 0.5 and about 3 microns. The remaining structure of the machine tool of FIG. 2 could be similar to that described above with reference to FIG. 1.

Figure 3:
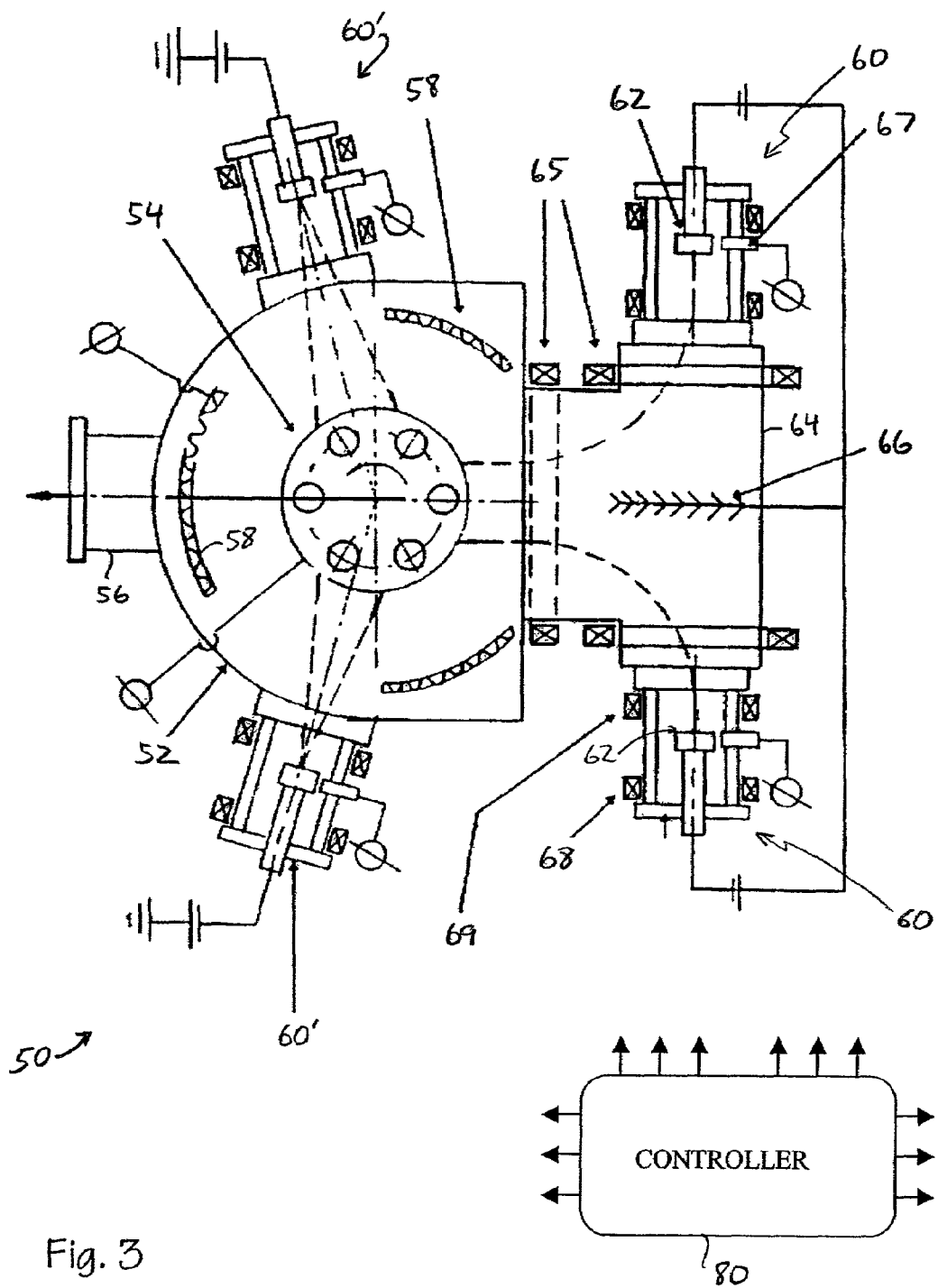
FIG. 3 is a schematic illustration of a device for coating a machine tool according to the present invention.
Figure 4:
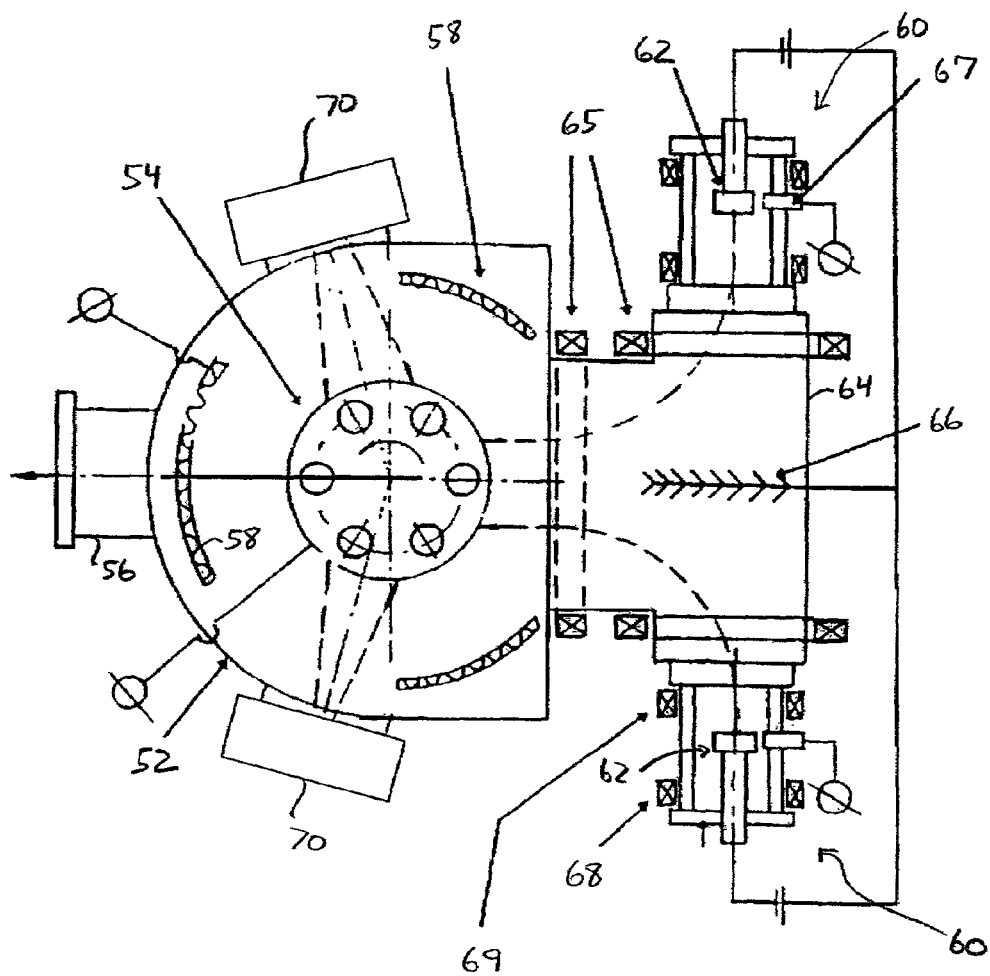
FIG. 4 is a schematic illustration of a device for coating a machine tool according to another embodiment of the present invention.
Figure 4:
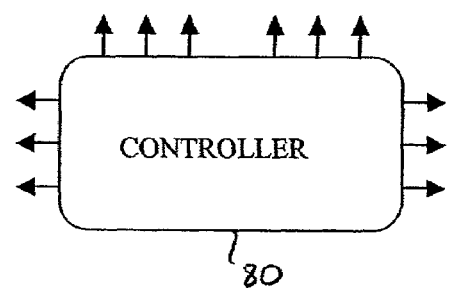

Referring now to FIGS. 3 and 4, methods and apparatus for forming the coated machine tool of the present invention are illustrated in detail. Each coating device 50 comprises a hermetically sealed process chamber 52, a pair of filtered cathodic arc sources 60, a pair of direct cathodic arc sources 60' (FIG. 3) or magnetron sputtering assemblies 70 (FIG. 4), and a deposition controller 80. It is initially noted that the apparatus of FIG. 4 differs from the apparatus of FIG. 3 in that it includes magnetron sputtering assemblies 70 in place of the direct arc sources 60' of FIG. 3. As such the apparatus of FIG. 4 is better suited for formation of the machine tool 10 illustrated in FIG. 2 because its magnetron sputtering assemblies 70 are better-suited for formation of the alkaline earth metal fluoride overlayer 35. In either case, the manner of operation of each device is substantially the same and will be described together herein.

The hermetically sealed process chamber 52 is configured to accommodate a base machine tool material on a multi-position stage 54 therein. A universal port 56 is also provided in communication with a vacuum pump and gas supplies (not shown). In this manner, the port 56 functions as a vacuum port and a process gas inlet port. It is contemplated that a plurality of distinct ports may be provided for each of these functions.

The filtered cathodic arc sources 60 are in communication with the hermetically sealed process chamber 52 and are arranged to deposit selected materials over a base machine tool material in the process chamber 52. The filtered cathodic arc sources 60 are also arranged to separate components of the relatively hard material from macroparticles formed by localized arc melting of respective target portions 62 of each filtered cathodic arc source 60. Specifically, the filtered arc sources 60 are installed in a rectangular plasma guide chamber 64 surrounded by rectangular deflecting coils 65. The filtered arc sources 60 allow deposition of droplet free coatings by deflecting the plasma flow along curvilinear magnetic lines of force towards the main deposition chamber 52 where substrates are supported by the multi-position stage 54. In this process, droplets or macroparticles having straight trajectories are captured on baffles of an anode 66. Machine tools having intricate geometry may be coated in the coating device of the present invention because the width of the plasma flow is about 10 inches (25 cm) and the height is about 12–18 inches (30–45 cm). The multi-position stage 54 may comprise a double planetary rotation system.

The filtered arc sources 60 can be operated in electron emission mode for effective substrate cleaning. Highly energetic electrons can be extracted from chambers of the filtered arc sources 60 to the main deposition chamber 52 by energizing auxiliary anodes 58 and turning off the deflecting magnetic field. The extracted electrons ionize gas plasma in the deposition chamber to create a plasma envelope completely surrounding substrate materials located in the main deposition chamber 52. Using this technique very high ion currents can be obtained as compared to other PVD techniques such as e-beam evaporation and sputtering. High ion currents can be utilized in very effective cleaning of the substrate through appropriate substrate biasing. Both RF or DC substrate biasing can be utilized. Properly cleaned substrates provide surfaces for highly adherent coatings.

The direct arc sources 60' (FIG. 3) or magnetron sputtering assemblies 70 (FIG. 4) are also in communication with the hermetically sealed process chamber and are arranged to deposit the overlayer 35 over a material on the stage 54 in the process chamber 52. In one embodiment of the present invention, two 6" (15 cm) diameter magnetron sources are employed. However, it is noted that a variety of magnetron sources may be employed according to the present invention.

The deposition controller 80 is coupled to the various electronically controlled components of the device 50, i.e., to each magnetron sputtering assembly 70; each filtered arc source 60, including the cathode 62, igniter 67, and stabilizing and focusing coils 68, 69; the anode 66; the auxiliary anodes 58 and associated heaters (not shown); the stage 54, etc. It is noted that, with the exception of the specific aspects of the invention described herein, the manner in which the controller 80 is coupled to each of these components and the specific structure of these components is beyond the scope of the present invention and may be gleaned from conventional teachings related thereto.

The deposition controller 80 is configured and programmed to direct formation of a relatively hard underlayer over a base material or substrate in the process chamber by activation of the filtered cathodic arc sources 60. The controller 80 also directs formation of the chemically inert overlayer by activation of the direct arc sources 60' or the magnetron sputtering assemblies 70. In addition, the controller 80 also directs formation of interlayers between, above, or below already formed layers. For the purposes of describing and defining the present invention, it is noted that a layer or material formed over another layer or material need not be formed directly upon the underlying material. Rather, it is contemplated that an intervening layer or material may be positioned between the layer formed over the underlying layer and the underlying layer.

A machine tool comprising a wear resistant low friction multi-layer coating is produced by providing a base material of the machine tool and forming the layers illustrated in FIGS. 1 and 2 over the base material. The relatively hard underlayer 25, the interlayer 30, and the overlayer 35 of FIG. 1 are preferably formed using the direct and filtered cathodic arc sources 60, 60'. Nitriding or carbonizing gas is introduced into the process chamber to for nitride or carbo-nitride portions of the relatively hard underlayer 25. The alkaline earth metal fluoride overlayer 35 of FIG. 2 is preferably formed through a magnetron sputtering technique. Graded layers may be formed through a combination of a magnetron sputtering technique and cathodic arc techniques where gradations in composition may be achieved by timing respective active states of the magnetron sputtering technique and the cathodic arc technique. The timing sequence of the respective active states is selected such that the component ratio changes across the graded region. Alternatively, variation of the component ratio may be achieved by varying the power controlling the magnetron sputtering technique and the cathodic arc technique.

In operation, the large area filtered arc sources 60 are installed in a rectangular plasma guide chamber surrounded by rectangular deflecting coils 65. The filtered arc sources allow deposition of droplet free coatings by deflecting the plasma flow along curvilinear magnetic lines of force towards the main deposition chamber 52 where substrates are located. The width of the plasma flow is about 10 inches (25 cm) and the height of 12–18 inches (30–45 cm). The filtered arc source can be 60 operated in electron emission mode. Highly energetic electrons can be extracted from the filtered arc chamber to the main deposition chamber by energizing the auxiliary anode. This can be accomplished by turning off the deflecting magnetic field. The extracted electrons can be used to ionize the gas plasma in the deposition chamber. In this manner, a plasma envelope can be created which can completely surround the substrate material located in the main deposition chamber 52. Using this technique, very high ion currents can be obtained as compared to other PVD techniques such as e-beam evaporation and sputtering. High ion currents can be utilized in very effective cleaning of the substrate through appropriate substrate biasing. Both RF or DC substrate biasing can be utilized. A properly cleaned substrate can provide surface for highly adherent coating.

Uncoated machine tools commonly possess some sort of grease/oil and a passive oxide layer that need to be cleaned thoroughly before depositing hard wear resistant coatings. Accordingly, cleaning is important to achieving a highly adherent coating on steel and carbide substrates. Carbide tools and other end-mill products also commonly possess fragmented cobalt leached surfaces that need to be removed before coating. Hence, substrate cleaning procedures are preferably incorporated into the coating process.

Specifically, oil and grease may be removed from a tool substrate surface in an alkaline degrease step. Typical degreasers used are highly alkaline in nature and preferably used in ultra-sonic baths for effective cleaning. A water rinse may be employed to remove traces of degreaser. For oxide and rust removal two steps are typically executed—acid cleaning and dry blasting or liquid honing. In acid cleaning, phosphoric acid based solutions are used to remove the rust or oxide layer on the surface of the tool. In dealing with carbides, care should be taken to limit the dip times to few seconds in order to avoid cobalt leaching. More persistent oxide layers are removed with vigorous dry blasting or liquid honing using fine mesh alumina or silicon carbide powders. Tools are preferably rinsed with de-ionized water and cleaned with a detergent ultra-sonic water cleaning to clean away the residues of blasting/honing process. Finally, the tools are again thoroughly rinsed in DI water, dried in nitrogen and packed-up in aluminum foils.

After initial cleaning, a plurality of uncoated cutting tools are loaded into the deposition chamber. The coating chamber is evacuated to a base pressure of $8 \times 10^{-3}$ Pa. The tools are then heated to a deposition temperature of about 400° C. The heating is typically done for one hour but heating times will vary depending upon the metallurgy of the substrate material. Substrate temperature may be sensed by a thermocouple placed in the chamber.

After heating, substrates may be subjected to a plasma cleaning process employing argon glow discharge and metal ion bombardment. In argon glow discharge, plasma glow discharge of Argon and hydrogen gases is employed to reduce the tool surface of oxide layers and also to etch the surface to physically sputter out contaminants. In metal ion bombardment, metal ions extracted from one of the arc sources can be accelerated to high kinetic energies with elevated bias voltages. The accelerated ions are directed to the substrate to effectively sputter clean the surface of the tools. This step should be limited to few minutes in order to avoid droplet accumulation on the tool surface, if the arc source used is of the direct arc type.

Following surface preparation, the substrates are ready for coating. The underlayer 25 may be formed using a direct cathodic arc deposition process. In the direct cathodic arc deposition process, cathodes of the material to be coated, e.g., Ti or mixed Ti and Al, are placed in the direct arc locations in the chamber. The arc current is set at a suitable level, e.g., 70 Amps and the auxiliary anode is maintained at a suitable level, e.g., 10 Amps. A nitrogen gas pressure of $6 \times 10^{-2}$ Pa chamber pressure is maintained in the chamber and the substrates are kept at a suitable bias voltage, e.g., −30 V. The substrates are rotated at a speed of 10 rpm.

A thin bond or interlayer 30 of, e.g., TiAl is provided prior to formation of the overlayer 35. Where a $Y_2O_3$ overlayer 35 is to be formed, a yttrium cathode is located in the filter arc chamber and deposition is carried out at pure oxygen pressure of $6 \times 10^{-2}$ Pa. Revolution speed is typically maintained at 10 rpm and the arc current is maintained at 70 Amps. This deposition is carried out for 45 mins. to achieve a thickness of about 0.6 microns. As is noted above, a slight variation in step may also be done to prepare a TiAlYN coating configuration. According to this aspect of the present invention, the yttrium target is kept on during the deposition of TiAlN to have a composite TiAlYN layer.

To deposit the intermixed metal fluoride overlayer 35 illustrated in FIG. 2, a $CaF_2$+Ag layer is formed using a magnetron sputtering process. To do this, a composite $CaF_2$+Ag sputter target was used. For example, the target is sputtered at 300 watt RF power. An argon gas pressure of ~1 Pa is preferably maintained and the substrates are preferably DC biased at ~−50V.

The machining performance of the coated machine tools according to the present invention has been evaluated and shown to yield significantly (50%) reduced tool wear for carbide inserts. In specific evaluations, the work piece material was Ti6A14V alloy and the specific machining operation was turning.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Having described the invention in detail and by reference to preferred embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A coated machine tool comprising a multilayer wear resistant coating applied to a base material of said machine tool, said coating comprising a relatively hard underlayer and a chemically inert rare earth oxide overlayer, wherein:
   said relatively hard underlayer is formed over said base material of said machine tool and comprises at least two layers;
   one of said layers of said underlayer comprises a metal and is formed over said base material;
   another of said layers of said underlayer comprises a metal nitride, metal carbide, or metal carbo-nitride and is formed over said metal layer;
   said rare earth oxide overlayer is formed over said underlayer and said overlayer constitutes the outermost layer of the coated machine tool; and
   said rare earth oxide overlayer comprises a rare earth oxide that exhibits positive free energies of reaction with titanium.

2. A coated machine tool as claimed in claim 1 wherein said rare earth oxide comprises an oxide of scandium.

3. A coated machine tool as claimed in claim 1 wherein said rare earth oxide comprises an oxide of lanthanum.

4. A coated machine tool as claimed in claim 1 wherein said rare earth oxide comprises an oxide of yttrium.

5. A coated machine tool comprising a multilayer wear resistant coating for application to a base material of said machine tool, said coating comprising a relatively hard underlayer, an yttrium oxide overlayer, and an interlayer between said underlayer and said overlayer, wherein:
   said relatively hard underlayer is formed over said base material of said machine tool;
   said yttrium oxide overlayer is formed over said interlayer and said overlayer constitutes the outermost layer of the coated machine tool;
   said interlayer comprises first and second components;
   said first component of said interlayer comprises yttrium;
   relative proportions of said first and second components of said interlayer are graded across said interlayer such that a quantity of said yttrium in said interlayer increases from a side of said interlayer adjacent to said underlayer to a side of said interlayer adjacent to said overlayer; and
   said yttrium oxide overlayer exhibits positive free energies of reaction with titanium.

* * * * *